United States Patent
Miura et al.

(10) Patent No.: US 7,508,127 B2
(45) Date of Patent: Mar. 24, 2009

(54) MULTICOLOR LIGHT-EMITTING DEVICE

(75) Inventors: Seishi Miura, Sagamihara (JP);
Hidemasa Mizutani, Sagamihara (JP);
Shigeki Kondo, Hiratsuka (JP);
Masahiro Fushimi, Zama (JP); Takashi Moriyama, Yokohama (JP)

(73) Assignee: Canon Kabushiki Kaisha, Toyko (JP)

( * ) Notice: Subject to any disclaimer, the term of this patent is extended or adjusted under 35 U.S.C. 154(b) by 176 days.

(21) Appl. No.: 10/529,281

(22) PCT Filed: Oct. 6, 2003

(86) PCT No.: PCT/JP03/12771

§ 371 (c)(1),
(2), (4) Date: Mar. 25, 2005

(87) PCT Pub. No.: WO2004/034750

PCT Pub. Date: Apr. 22, 2004

(65) Prior Publication Data

US 2006/0033425 A1    Feb. 16, 2006

(30) Foreign Application Priority Data

Oct. 8, 2002    (JP)    ............... 2002-294676

(51) Int. Cl.
*H01J 1/62*    (2006.01)
(52) U.S. Cl. ........................... 313/506; 313/504
(58) Field of Classification Search ................. 313/504, 313/506
See application file for complete search history.

(56) References Cited

U.S. PATENT DOCUMENTS

| | | | |
|---|---|---|---|
| 5,554,911 A * | 9/1996 | Nakayama et al. ......... 313/504 |
| 5,698,858 A | 12/1997 | Börner et al. ............ 250/484.2 |
| 5,756,224 A | 5/1998 | Börner et al. ............... 428/690 |
| 6,117,529 A * | 9/2000 | Leising et al. .............. 428/209 |
| 6,541,130 B2 | 4/2003 | Fukuda et al. .............. 428/690 |
| 6,812,497 B2 | 11/2004 | Kamatani et al. ............. 257/79 |
| 6,838,818 B2 | 1/2005 | Furugori et al. ............. 313/504 |
| 7,081,871 B2 * | 7/2006 | Kanno et al. ................. 345/76 |
| 2001/0019782 A1 | 9/2001 | Igarashi et al. .............. 428/690 |

(Continued)

FOREIGN PATENT DOCUMENTS

EP    1065737    1/2001

(Continued)

OTHER PUBLICATIONS

O'Brien et al., "Improved Energy Transfer ... devices", Appl. Phys. Lett., vol. 74, No. 3, 442-444 (Jan. 1999).

(Continued)

*Primary Examiner*—Peter Macchiarolo
(74) *Attorney, Agent, or Firm*—Fitzpatrick, Cella, Harper & Scinto

(57) ABSTRACT

A multicolor light-emitting device includes a plurality of organic EL devices each having two or more different luminescent colors. The multicolor light-emitting device includes a plurality of organic EL devices each having an organic compound layer including a light-emitting layer 12 between a reflecting electrode 11 and a transparent electrode 14. The plurality of organic EL devices each has two or more different emission spectra, wherein light-emitting regions in the light-emitting layer of the organic EL devices each having different emission spectra are located in different positions in the layer thickness direction corresponding to the different emission spectra.

8 Claims, 8 Drawing Sheets

U.S. PATENT DOCUMENTS

| | | |
|---|---|---|
| 2002/0021268 A1* | 2/2002 | Yamazaki et al. ............. 345/80 |
| 2002/0030443 A1 | 3/2002 | Konuma et al. ............. 313/504 |
| 2003/0141809 A1 | 7/2003 | Furugori et al. ............. 313/504 |
| 2003/0189216 A1 | 10/2003 | Kamatani et al. ............. 257/79 |
| 2006/0033425 A1* | 2/2006 | Miura et al. ................ 313/504 |

FOREIGN PATENT DOCUMENTS

| | | |
|---|---|---|
| JP | 11-256148 | 9/1999 |
| JP | 11-329739 | 11/1999 |
| JP | 2000-150152 | 5/2000 |
| JP | 2001/23776 | 1/2001 |
| JP | 2001/189193 | 7/2001 |
| JP | 2001/247859 | 9/2001 |
| JP | 2002/141170 | 5/2002 |
| JP | 2002-158090 | 5/2002 |
| JP | 2002/289358 | 10/2002 |
| WO | WO 01/26425 | 4/2001 |

OTHER PUBLICATIONS

Baldo et al., "Very high-efficiency green . . . electrophosphorescence", Appl. Phys. Lett., vol. 75, No. 1, (Jul. 4-6, 1999).

Fukuda et al., An organic LED display . . . RGB Colors, Synthetic Metals, vols. 111-112, Proc. Of 2$^{nd}$ Int'l. Conf. on Electroluminescence . . . Phenomena, Jun. 1-6, 2000.

Translation of Official Action in 2003 80101052.8 (China) dated Mar. 21, 2008.

* cited by examiner

FIG. 3
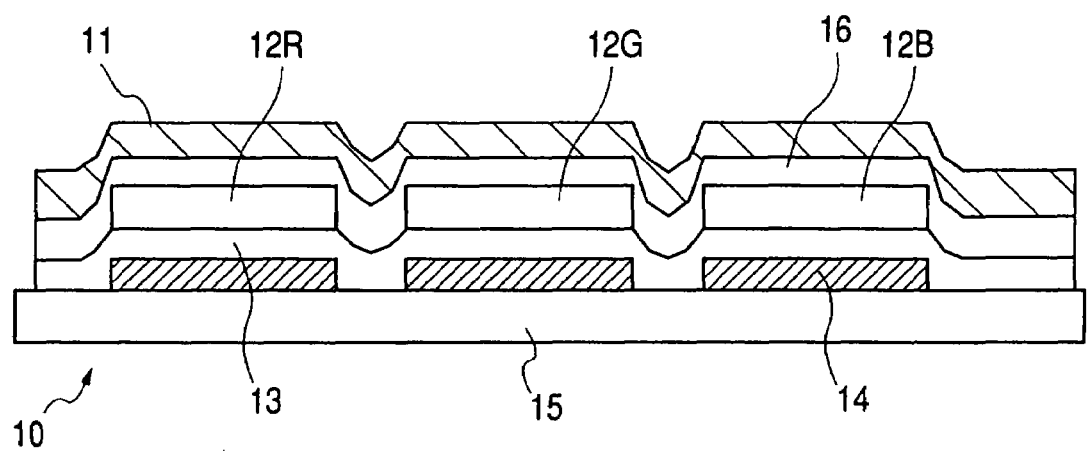
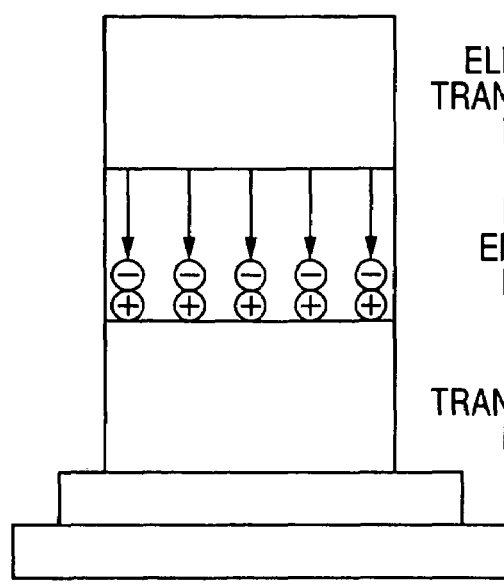
FIG. 4A
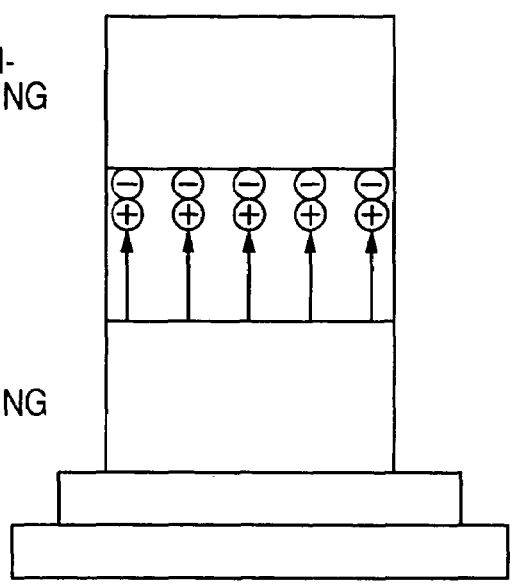
FIG. 4B

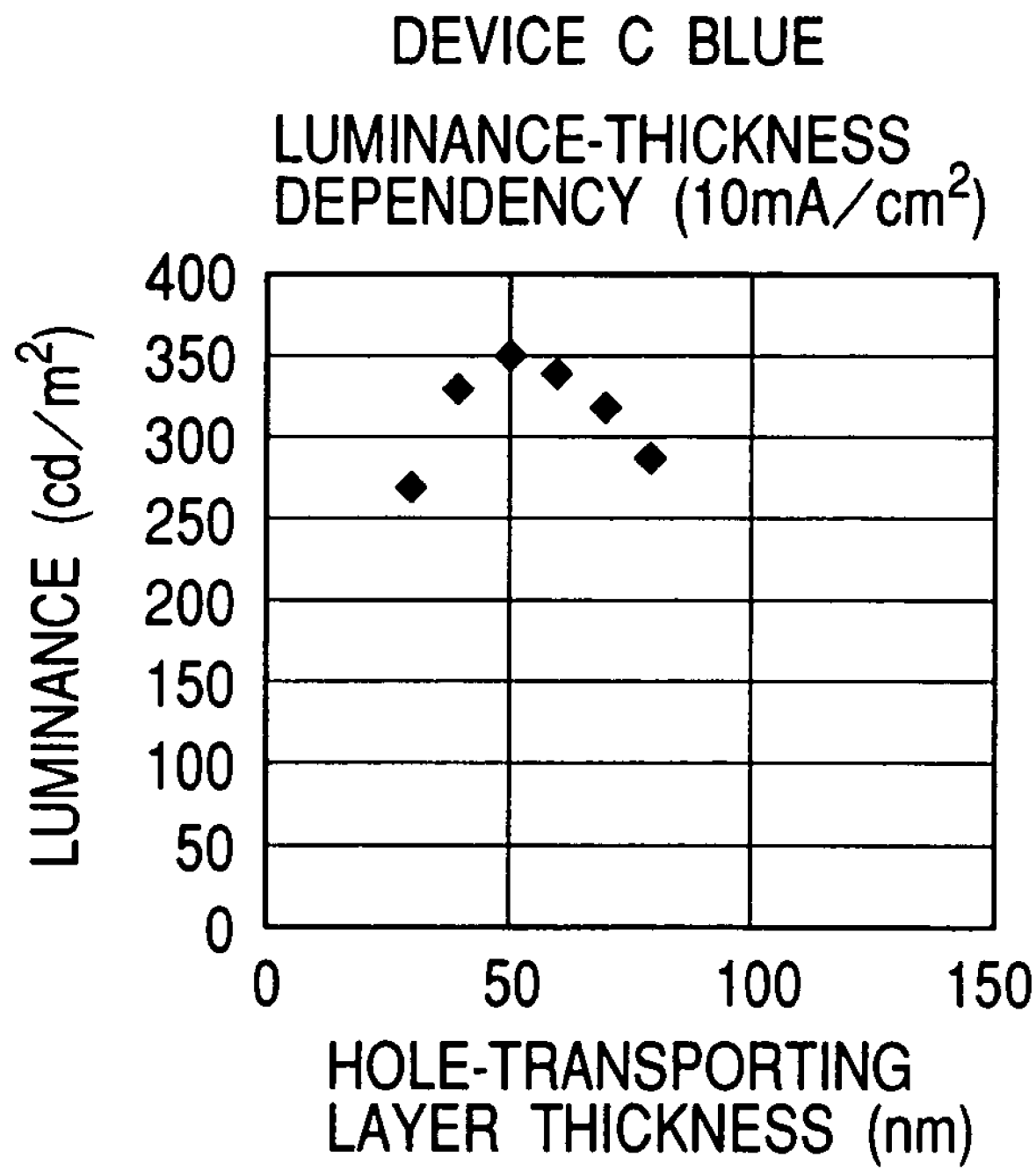

MULTICOLOR LIGHT-EMITTING DEVICE

TECHNICAL FIELD

The present invention relates to a multicolor light-emitting device used for a flat panel display, a projection display, a printer and the like.

BACKGROUND ART

In recent years, a flat-panel-ready self-emitting device has been receiving attention. The self-emitting device includes a plasma light-emitting display device, a field emission device, an electroluminescence (EL) device and the like.

Among them, in particular, an organic EL device has been demonstrated by T. W. Tang et al. in 1987 that high luminance emission can be obtained by a low voltage DC drive utilizing a structure in which the thin films made of a fluorescent metal-chelate complex and a diamine-based molecule are stacked, and its research and development have been pursued energetically. In these low-molecular-based organic EL devices, area-color type displays of green single color and of green color and additional colors such as blue and red have been commercialized, and the development for full-colorization is being activated at present.

As the organic EL device, there is a carrier injection type self-emitting device utilizing the emission that is produced when the electron and the hole that have reached a light-emitting layer are recombined. FIG. 1 shows a configuration of a typical organic EL device. A metal electrode is used for a cathode 11 and a transparent electrode is used for an anode 14 in order to take out the emitted light. An organic compound layer is sandwiched between these electrodes. In FIG. 1, the organic compound layer is composed of a light-emitting layer 12 and a hole-emitting layer 13.

Each of the organic layers that compose the organic compound layer generally has a thickness of approximately several tens of nanometers. As metal materials for the cathode, the metals having a small work function such as aluminum, an alloy of aluminum and lithium and an alloy of magnesium and silver are typically used. A transparent conductive material having a large work function such as indium tin oxide (ITO) is used for the anode.

The organic compound layer typically has a two-layer structure consisting of a light-emitting layer 12 and a hole-transporting layer 13 as shown in FIG. 1, or a three-layer structure consisting of an electron-transporting layer 22, a light-emitting layer 23 and a hole-transporting layer 24. The hole-transporting layer has the function for efficiently injecting holes from the anode into the light-emitting layer, and the electron-transporting layer has the function for efficiently injecting electrons from the cathode into the light-emitting layer. In addition, the hole-transporting layer and the electron-transporting layer have the (carrier blocking) function for blocking electrons and holes within the light-emitting layer, respectively, which is effective to enhance the emission efficiency.

A liquid crystal display that is already commercialized as a full-color flat panel display has achieved the full-colorization using color filters and the like. However, the organic EL device can self-emit primary colors of red, green and blue by appropriately selecting materials for composing the light-emitting layer and has excellent advantages of a higher speed response and a wider view angle than the liquid crystal display.

A dye-doped organic EL device in which a host material is doped with a fluorochrome is typically utilized because in the emission of each color of red, green and blue, it is difficult to obtain sufficient luminance and color purity by the light-emitting layer comprised of a single light-emitting material. This is the technique in which the material that composes a hole-transporting layer, an electron-transporting layer or a light-emitting layer in FIG. 1 or 2 is used for a host and doped with a very small amount of fluorochrome to take out the luminescence from the fluorochrome as a luminescent color. The advantage of this method is that the improvement of efficiency can be expected since the dye having a high fluorescent yield can be utilized and the selection of the luminescent color is greatly improved.

The light emission generally used in the organic EL device is taken out from fluorescence that is produced when the singlet excitons of the molecule in the luminescence center change to the ground state. On the other hand, the device that does not utilize the fluorescent emission through the singlet excitons but utilizes the phosphorescent emission through the triplet excitons is being investigated. Published exemplary references include, for example, the following Non-Patent Reference 1 and Non-Patent Reference 2.

The configuration in which the organic layer has four layers is mainly used in these references. It consists of a hole-transporting layer, a light-emitting layer, an exciton diffusion-preventing layer and an electron-transporting layer. The used materials are a carrier-transporting material and a phosphorescent-emitting material shown below.

An abbreviation of each material is shown below:

Alq$_3$: aluminum-quinolinol complex

α-NPD: N4,N4'-Di-naphthalen-1-yl-N4,N4'-diphenyl-biphenyl-4,4'-diamine

CBP: 4,4'-N,N'-dicarbazole-biphenyl

BCP: 2,9-dimethyl-4,7-diphenyl-1,10-phenanthroline

PtOEP: platinum-octaethylporphyrin complex

Ir(ppy)$_3$: iridium-phenylpyrimidine complex

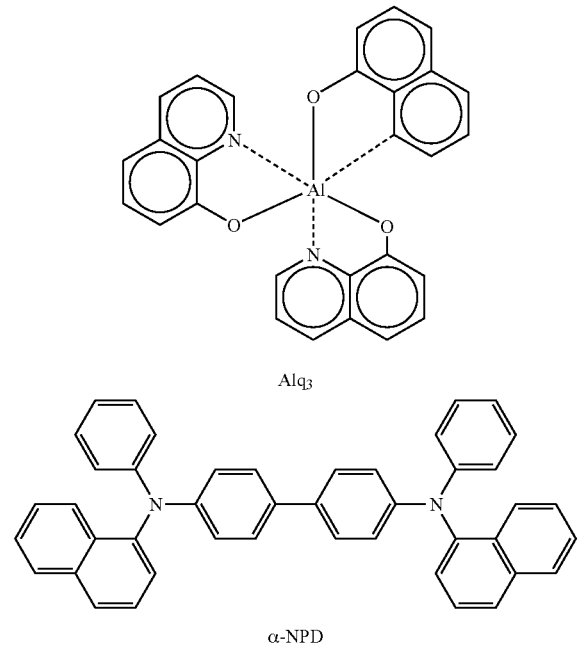

Alq$_3$

α-NPD

-continued

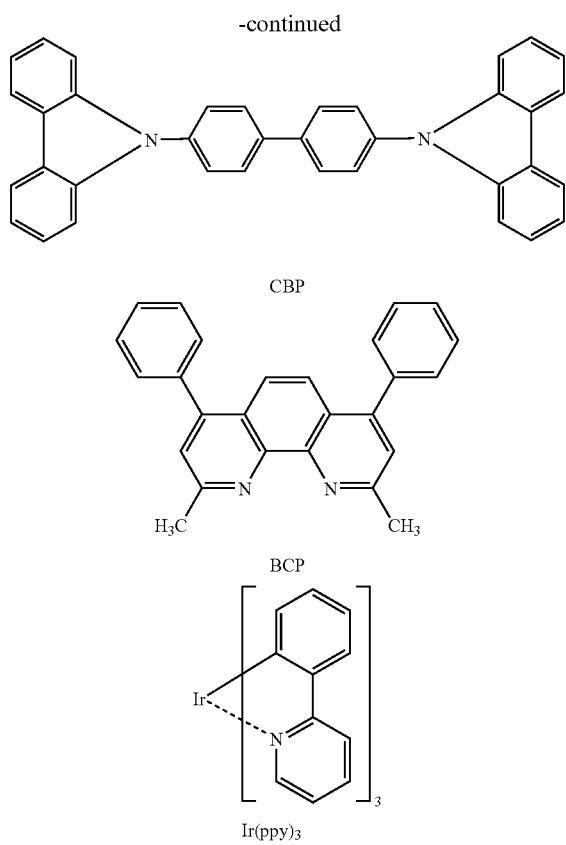

CBP

BCP

Ir(ppy)₃

In both of the above described non-patent references 1 and 2, high efficiency was obtained for the devices formed by using, as hosts, α-NPD for a hole-transporting layer, Alq₃ for an electron-transporting layer, BCP for an exciton diffusion-preventing layer and CBP for a light-emitting layer and incorporating into them PtOEP or Ir(ppy)₃ that is a phosphorescent-emitting material in a concentration of approximately 6%.

The phosphorescent-emitting material has particularly received attention because high light emission efficiency can be expected in principle. The excitons formed by the recombination of carriers consist of singlet excitons and triplet excitons, in which the probability of occurrence is 1:3. Conventional organic EL devices have been taking out the phosphorescence when the singlet excitons cause the transition to the ground state, in which the emission yield is 25% relative to the number of excitons formed in principle, which has been the upper limit in principle. However, if the phosphorescence from the excitons formed from the triplet is used, at least three times yield can be expected in principle. Furthermore, if the transition from the singlet to the triplet by the intersystem crossing that is high as energy is taken into account, the four times emission of 100% can be expected in principle.

Other references requiring the emission from the triplet disclose an organic EL device and a method for producing it (Patent Reference 1), a light-emitting material and an organic EL device using it (Patent Reference 2), an organic electroluminescent device (Patent Reference 3) and the like.

Furthermore, Non-Patent Reference 3 reports that in the above described EL devices, the amount of light that can be taken out to the outside changes according to the thickness of each of the functional films composing the devices, due to the light interference effect.

According to Non-Patent Reference 3, since there exists the optimum thickness of the electron-transporting layer relative to the emission wavelength, the thickness of each of the layers composing the EL device need to be optimized for each color in the EL panels having two emission colors or more. And in order to optimize it, Patent Reference 4 discloses a method for adjusting the thickness of the electron-transporting layer and optimizing the take-out efficiency of light.

Patent Reference 1: Japanese Patent Application Laid-Open No. 11-329739

Patent Reference 2: Japanese Patent Application Laid-Open No. 11-256148

Patent Reference 3: U.S. Pat. Nos. 5,698,858 and 5,756,224

Patent Reference 4: U.S. Pat. No. 6,541,130

Non-Patent Reference 1: D. F. O'Brien et al., "Improved energy transfer in electrophosphorescent device", Applied Physics Letters (United States), 1999, Vol. 74, No. 3, p. 422

Non-Patent Reference 2: M. A. Baldo et al., "Very high-efficiency green organic light-emitting devices based on electrophosphorescence", Applied Physics Letters (United States), 1999, Vol. 75, No. 1, p. 4

Non-Patent Reference 3: Yoshinori Fukuda et al., "An Organic LED display exhibiting pure RGB colors", Synthetic Metals, 2000, 111-112, P. 1-6.

However, in order to achieve a device having a low price and high efficiency, it has been desired to prepare the device having high take-out efficiency of light using a process having smaller number of steps.

SUMMARY OF THE INVENTION

The present invention has been accomplished in view of the above problems, and it is an object of the present invention to provide a multicolor light-emitting device comprising a plurality of organic EL devices each having two or more different luminescent colors in which the take-out efficiency of the emission of each color can be optimized by a simple configuration and which has a low price and high efficiency.

Therefore, the present invention provides a multicolor light-emitting device characterized by comprising a plurality of organic electroluminescence devices each having an organic compound layer including a light-emitting layer between a first electrode and a second electrode, the plurality of organic electroluminescence devices having two or more different emission spectra, wherein light-emitting regions in the light-emitting layer of the organic electroluminescence device having the different emission spectra are located in different positions in the layer thickness direction of the light-emitting layer corresponding to the different emission spectra.

In addition, the multicolor light-emitting device according to the present invention includes the following as the preferred embodiments.

The organic compound layer has a stacked structure in which a light-emitting layer is sandwiched at least between a first charge-transporting layer and a second charge-transporting layer.

The first electrode is a reflecting electrode that reflects light;

the second electrode is a transparent electrode; and the first charge-transporting layer is located at the first electrode side of a light-emitting layer.

The emission of two different colors, the position of the light-emitting region in a shorter wavelength light-emitting layer that is the light-emitting layer of the organic electroluminescence device for emitting the light of shorter wavelength is closer to the first electrode than the position of the light-emitting region in a longer wavelength light-emitting layer that is the light-emitting layer of the organic electroluminescence device for emitting the light of longer wavelength.

In addition, of the emission of two different colors, a shorter wavelength light-emitting layer that is the light-emitting layer of the organic electroluminescence device for emitting the light of shorter wavelength has the properties of preferentially transporting holes;

a longer wavelength light-emitting layer that is the light-emitting layer of the organic electroluminescence device for emitting the light of longer wavelength has the properties of preferentially transporting electrons;

the first charge-transporting layer is an electron-transporting layer that preferentially transports electrons; and the second charge-transporting layer is a hole-transporting layer that preferentially transports holes, or, of the emission of two different colors, a shorter wavelength light-emitting layer that is the light-emitting layer of the organic electroluminescence device for emitting the light of shorter wavelength has the properties of preferentially transporting electrons;

a longer wavelength light-emitting layer that is the light-emitting layer of the organic electroluminescence device for emitting the light of longer wavelength has the properties of preferentially transporting holes;

the first charge-transporting layer is a hole-transporting layer that preferentially transports holes; and the second charge-transporting layer is an electron-transporting layer that preferentially transports electrons.

Further, the light-emitting layer has a thickness in the range of 10 to 35 nm.

The material and the thickness of the first charge-transporting layer are the same as those for all of the organic electroluminescence devices.

The material and the thickness of the second charge-transporting layer are the same as those for all of the organic electroluminescence devices.

Furthermore, the present invention includes the following as the preferred embodiments.

The first electrode is a reflecting electrode that reflects light;

the second electrode is a transparent electrode;

the organic compound layer includes a first charge-transporting layer, the first charge-transporting layer being located at the first electrode side of the light-emitting layer.

The emission of two different colors, the position of the light-emitting region in a shorter wavelength light-emitting layer that is the light-emitting layer of the organic electroluminescence device for emitting the light of shorter wavelength is closer to the first electrode than the position of the light-emitting region in a longer wavelength light-emitting layer that is the light-emitting layer of the organic electroluminescence device for emitting the light of longer wavelength.

In addition, of the emission of two different colors, a shorter wavelength light-emitting layer that is the light-emitting layer of the organic electroluminescence device for emitting the light of shorter wavelength has the properties of preferentially transporting holes;

a longer wavelength light-emitting layer that is the light-emitting layer of the organic electroluminescence device for emitting the light of longer wavelength has the properties of preferentially transporting electrons; and the first charge-transporting layer is an electron-transporting layer that preferentially transports electrons, or, of the emission of two different colors, a shorter wavelength light-emitting layer that is the light-emitting layer of the organic electroluminescence device for emitting the light of shorter wavelength has the properties of preferentially transporting electrons;

a longer wavelength light-emitting layer that is the light-emitting layer of the organic electroluminescence device for emitting the light of longer wavelength has the properties of preferentially transporting holes; and the first charge-transporting layer is a hole-transporting layer that preferentially transports holes.

In addition, the light-emitting layer has a thickness in the range of 10 to 35 nm.

The material and the thickness of the first charge-transporting layer are the same as those for all of the organic electroluminescence devices.

A display having the multicolor light-emitting device of the present invention.

In addition, the present invention includes that the two or more different emission spectra are the emission spectra exhibiting red, green and blue, as a preferred embodiment thereof.

BRIEF DESCRIPTION OF THE DRAWINGS

FIG. 3 is a schematic sectional view showing the configuration of one embodiment of the multicolor light-emitting device of the present invention;

FIGS. 4A and 4B are schematic diagrams explaining the relation between the charge-transporting properties of a light-emitting layer and light-emitting regions, in which FIG. 4A shows the case where a material having high electron-transporting capability is used for the light-emitting layer, and FIG. 4B shows the case where a material having high hole-transporting capability is used for the light-emitting layer;

FIGS. 6A and 6B are other schematic diagrams explaining the optical interference within an organic EL device, in which FIG. 6A shows the case where the light-emitting region is located at the interface with a first charge-transporting layer, and FIG. 6B shows the case where the light-emitting region is located at the interface with a second charge-transporting layer;

FIG. 12 is a graphical representation showing the dependency of the layer thickness on the luminance of a device C.

BEST MODE FOR CARRYING OUT THE INVENTION

Figure 1:
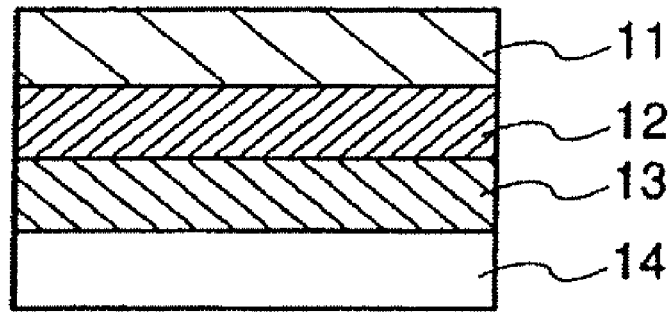
FIG. 1 is a schematic sectional view showing the configuration of a typical organic EL device.
Figure 2:
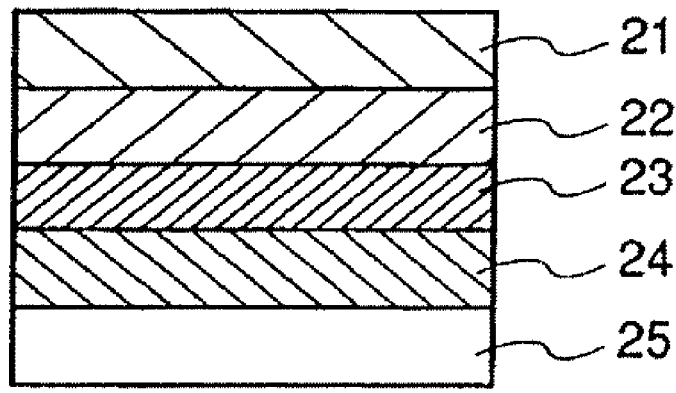
FIG. 2 is a schematic sectional view showing the configuration of another typical organic EL device.

One specific embodiment of the multicolor light-emitting device of the present invention will be described below with reference to FIG. 3, but the present invention is not limited to this embodiment.

In the multicolor light-emitting device 10 shown in FIG. 3, there are formed on a transparent substrate (base member) 15, in the mentioned order, a transparent electrode (second electrode) 14 as the anode; a second charge-transporting layer 13, a light-emitting layer 12 (12R, 12G or 12B) and a first charge-transporting layer 16 as the organic compound layer; and a reflecting electrode (first electrode) 11 as the cathode. In FIG. 3, the light-emitting layer 12 is separately applied like 12R, 12G and 12B corresponding to red, green and blue, respectively, and is in a state where three organic EL layers each having one of three different light-emitting spectra are located side by side. By the way, the drawings for the multicolor light-emitting device in the present specification show only the part of three (or two) organic EL devices, but the number of the organic EL devices that the multicolor light-emitting device comprises is not limited to these.

The base member used for forming thereon a plurality of organic electroluminescence devices that have the organic compound layer including a light-emitting layer between a first electrode and a second electrode needs to be transparent when light is to be taken out from the base material side, and preferably a transparent substrate is used. Specific substrates that can be suitably used include various glass substrates, glass substrates on which a drive circuit such as TFT is formed with poly-Si, a silicon wafer provided with a drive circuit thereon, and the like.

Of the first electrode and the second electrode, one is the anode and the other is the cathode. Regarding the materials for these electrodes, it is desirable that any one is made of a transparent material and the other is made of the material having high reflectance. A material having high work function is preferably used for the anode, and a material having low work function is preferably used for the cathode. Specifically, metal materials for the cathode that are suitably used include metals having low work function such as aluminum, an alloy of aluminum and lithium and an alloy of magnesium and silver. Moreover, transparent conductive materials having high work function such as indium tin oxide (ITO) are suitably used for the anode. By the way, when the cathode is to be used as a transparent electrode, there is a method, for example, in which a layer of the metal material that has low work function and can be suitably used for the cathode as described above is provided in a thickness of approximately 1 to 10 nm on a side in contact with the organic compound layer and a layer of the transparent conductive layer such as ITO is provided on the outside of it.

The organic layers such as a first charge-transporting layer, a light-emitting layer and a second charge-transporting layer that configure an organic compound layer is formed by vapor deposition or the like. Of the first and second charge-transporting layers, one is made of the material that preferentially transport holes (has high hole-transporting properties) and the other is made of the material that preferentially transport electrons (has high electron-transporting properties). These may be selected according to the polarities of the first electrode and the second electrode to be used.

Incidentally, the light-emitting layer to be used may include a single material from which a desired light emission can be obtained or a host material doped with a guest material. As the method for doping, the host material and the guest material are simultaneously vacuum deposited and respective deposition rates are adjusted to obtain the light-emitting layer having any dope concentrations. Depending on the fluorescent color at this time, any light emission can be obtained for each of the organic EL devices by changing the materials of the light-emitting layer or the combination of the host and the guest forming the light-emitting layer.

In the present invention, light-emitting regions in the light-emitting layer of the organic electroluminescence devices having different emission spectra (different emission spectra of 3 colors in the embodiment shown in FIG. 3) are located in different positions in the layer thickness direction corresponding to the different emission spectra.

Thus, it is possible to optimize the take-out efficiency of the light of the organic EL device for each color, even when the components other than the light-emitting layer, that is, the organic layers other than the light-emitting layer included in the organic compound layer (the first charge-transporting layer and the second charge-transporting layer in FIG. 3) and electrodes have the same materials, thickness and the like, among a plurality of organic EL devices each having different luminescent colors (light-emitting spectra) that are provided in the multicolor light-emitting device 10.

The effect of the present invention will now be described in detail with reference to FIGS. 4A, 4B, 5, 6A and 6B.

It is generally known that an organic EL device emits light in a local area within a light-emitting layer. For example, when a material having high electron-transporting capability is used for the light-emitting layer as shown in FIG. 4A, in the configuration in which the light-emitting layer is sandwiched between a hole-transporting layer and an electron-transporting layer, the electrons injected into the light-emitting layer move to the vicinity of the interface with the hole-transporting layer in the light-emitting layer by the electric field. On the other hand, the holes having low mobility cannot move a long distance and are recombined with electrons after injected into the light-emitting layer, so that the light-emitting region will be in the vicinity of the hole-transporting layer. Moreover, when a material having high hole-transporting capability is used for the light-emitting layer as shown in FIG. 4B, it is considered that the holes reach the vicinity of the interface with the electron-transporting layer and locally emit light at the interface with the electron-transporting layer.

Since each of the layers forming an organic EL device has a thickness of several tens of nanometers to approximately 200 nm typically, the take-out efficiency of light generally strongly is influenced by the layer thickness due to the light interference effect when the light emission occurs locally like this.

Figure 5:
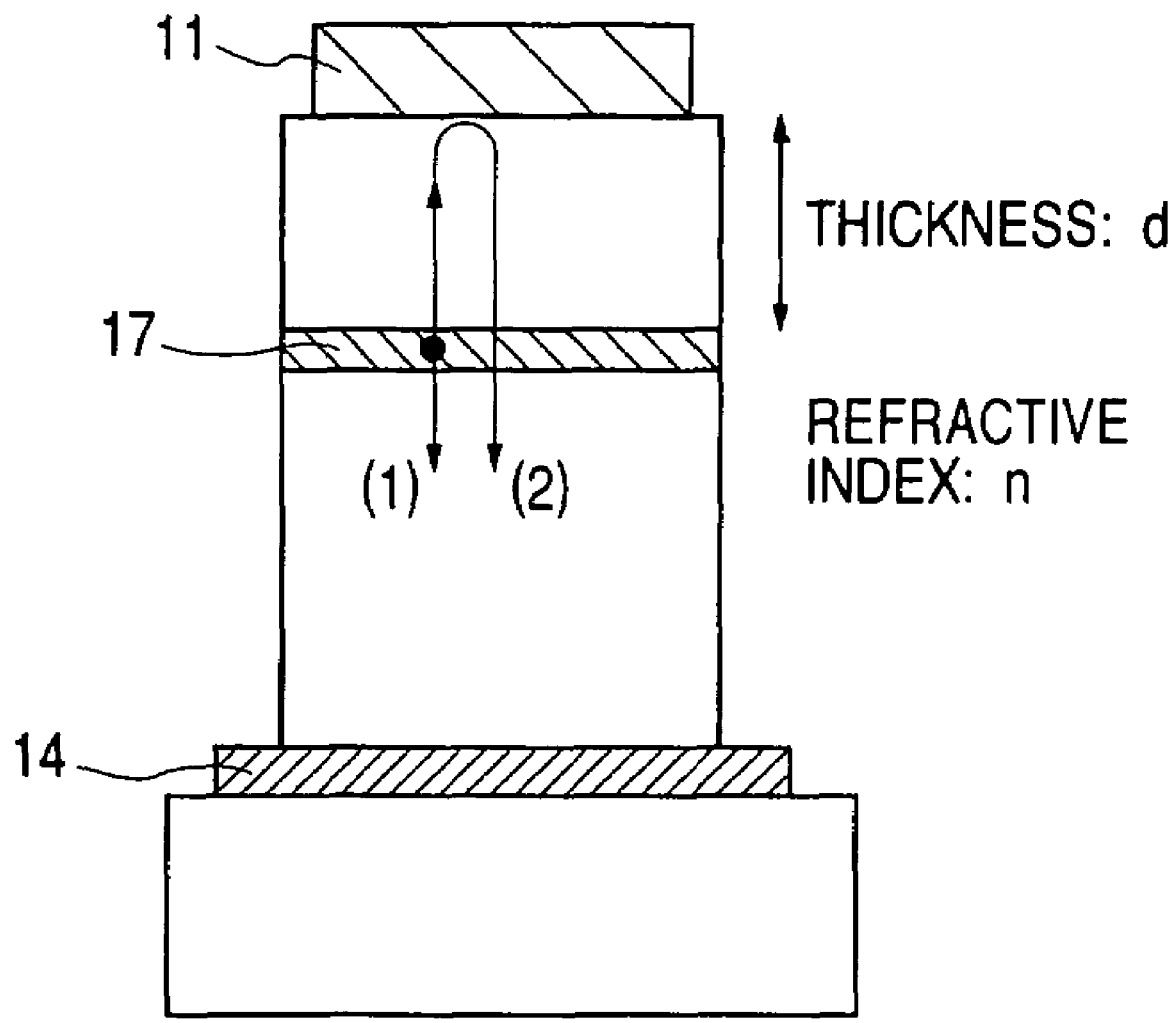
FIG. 5 is a schematic diagram explaining the optical interference within an organic EL device.

Then, with reference to FIG. 5, there is considered the interference between the light (1) that directly goes to the outside from the inside of the organic EL device and the light (2) that is taken out to the outside after reflecting at the reflecting electrode. The phase difference is represented by the equation:

$$\phi = 2\pi \frac{(nd) \times 2}{\lambda} + \pi \quad \text{(a)}$$

wherein d denotes the thickness of a layer between the reflecting electrode 11 and the light-emitting region 17; n denotes a refractive index; and λ denotes an emission wavelength.

The condition where the value of (1)+(2) gives the maximum value may be obtained by giving the maximum value to cos φ as represented by the equation:

$$nd = \frac{\lambda}{4}(1 + 2i) \text{ wherein} \quad \text{(b)}$$
$$i = 0, 1, 2, \ldots$$

Figure 6A:
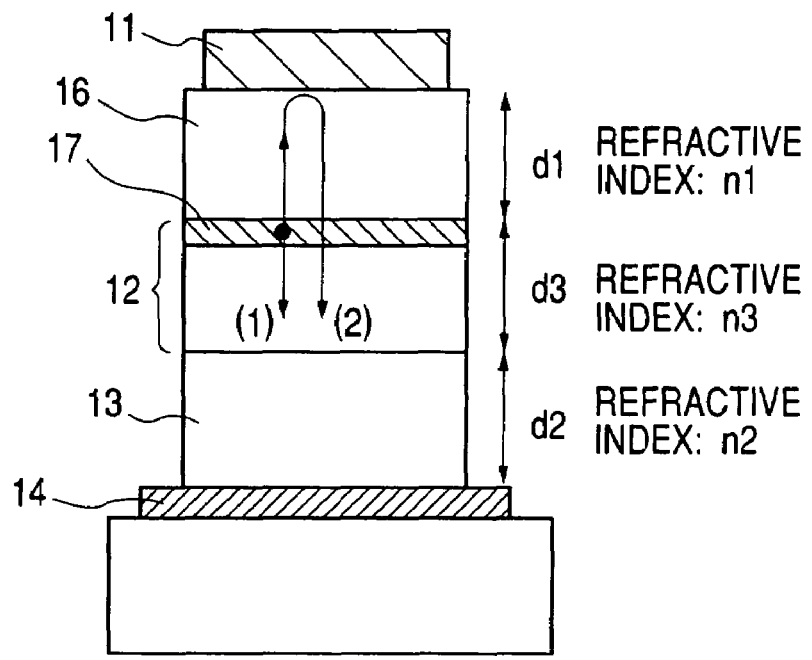
Figure 6B:
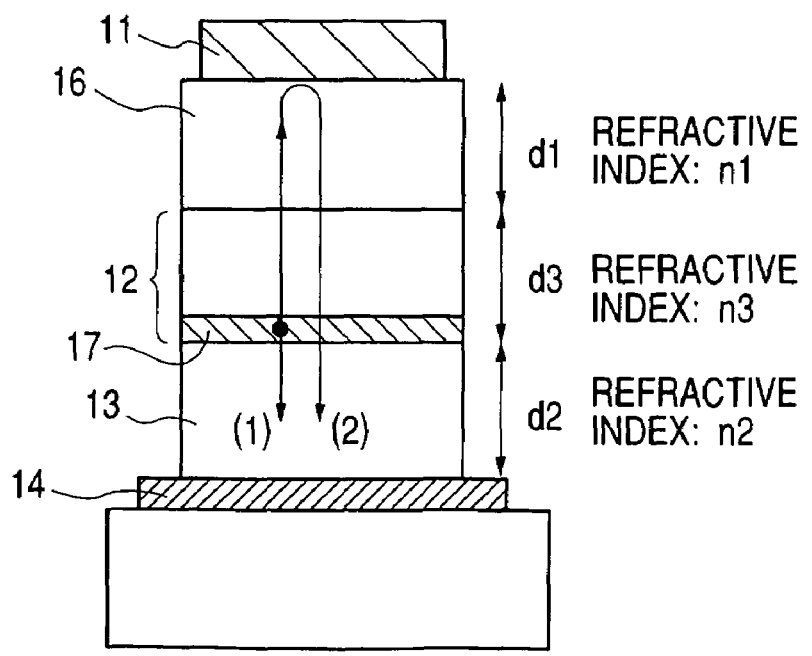

A plurality of organic layers is stacked in the practical organic EL devices and it is reported that in many cases the light emission occurs at the interface of the organic layer/organic layer. The optimum condition when the light-emitting region 17 in the light-emitting layer 12 is close to the reflecting electrode 11 like in FIG. 6A is represented by the equation:

$$n1da1 = \frac{\lambda a}{4}(1 + 2i) \text{ wherein} \quad \text{(c)}$$
$$i = 0, 1, 2, \ldots$$

wherein $\lambda_a$ denotes the peak emission wavelength; and n1 and da1 denote the refractive index and the thickness of the first charge-transporting layer 16 in FIG. 6A, respectively. Furthermore, the optimum condition when the light-emitting region 17 is close to the transparent electrode 14 like in FIG. 6B is represented by the equation:

$$nb1db1 + nb3db3 = \frac{\lambda b}{4}(1 + 2i) \text{ wherein} \quad \text{(d)}$$
$$i = 0, 1, 2, \ldots$$

wherein $\lambda_b$ denotes the peak emission wavelength, nb1 and db1 denote the refractive index and the thickness of the first charge-transporting layer 16 in FIG. 6B, respectively, and nb3 and db3 denote the refractive index and the thickness of the light-emitting layer 12 in FIG. 6B, respectively.

Then, in the case of $\lambda_b > \lambda_a$, the optimization of the take-out efficiency to each of the emissions is considered. In order to obtain the following equation from the equation (c) and the equation (d) above, da1=db1:

$$nb3db3 = \frac{(\lambda b - \lambda a)}{4}(1 + 2i) \quad \text{(e)}$$

It is possible to select nb3 and db3 to obtain da1=db1, that is, to achieve the commonality of the first charge-transporting layer and to optimize the take-out efficiency of the light for each wavelength.

Incidentally, in the case of practical multicolor light-emitting devices, it is necessary to consider the drive voltage, properties of the organic films and the like other than the optical take-out efficiency. Therefore, the thickness of practical devices needs not agree with the calculated optimum value described above.

For example, when the multicolor light-emitting device comprising two kinds of organic EL devices as shown in FIGS. 6A and 6B (refractive index: n1=n2=n3=1.8, peak emission wavelength: λa=520 nm, λb=620 nm) is considered, the take-out efficiency can be optimized for the light emission of λa and λb by giving d1=72 nm and d3=14 nm.

In order to have the light-emitting regions in the light-emitting layer in different positions in the thickness direction corresponding to different emission spectra, a first method is to utilize the charge-transporting properties of the light-emitting layer as described above. Specifically, the method comprises selecting the materials such that the hole- and the electron-transporting properties are different between a shorter wavelength light-emitting layer that is the light-emitting layer of an organic EL device for emitting the light of shorter wavelength and a longer wavelength light-emitting layer that is the light-emitting layer of an organic EL device for emitting the light of longer wavelength, of the light emission of two different colors.

Since the thickness of the organic layer is typically from several tens of nanometers to approximately 200 nm, which is smaller than the wavelength of a visible light, the position of the light-emitting region in a shorter wavelength light-emitting layer is preferably closer to the first electrode (reflecting electrode) than the position of the light-emitting region in a longer wavelength light-emitting layer, of the light emission of two different colors, in order to optimize the take-out efficiency of light.

Therefore, when a first electrode (reflecting electrode) is the cathode, it is preferable that the shorter wavelength light-emitting layer has the properties of preferentially transporting holes and the longer wavelength light-emitting layer has the properties of preferentially transporting electrons. On the other hand, when a first electrode (reflecting electrode) is the anode, it is preferable that the shorter wavelength light-emitting layer has the properties of preferentially transporting electrons and the longer wavelength light-emitting layer has the properties of preferentially transporting holes.

Another method for changing the position of the light emission in a light-emitting layer in the thickness direction is a method in which only an optional area in the light-emitting layer is doped with a light-emitting guest material.

In addition, considering the optimization of thickness in a visible wavelength region, it is preferable that the thickness of the light-emitting layer is in the range of 10 to 35 nm, since the assumed wavelength is approximately 650 nm to 450 nm and the refractive index is approximately 1.5 to 2.0.

Furthermore, the device prepared as described above is preferably covered with a metal or glass cover to intercept the outside air for the purpose of protecting it from oxygen and moisture (not shown).

EXAMPLE 1

Figure 7:
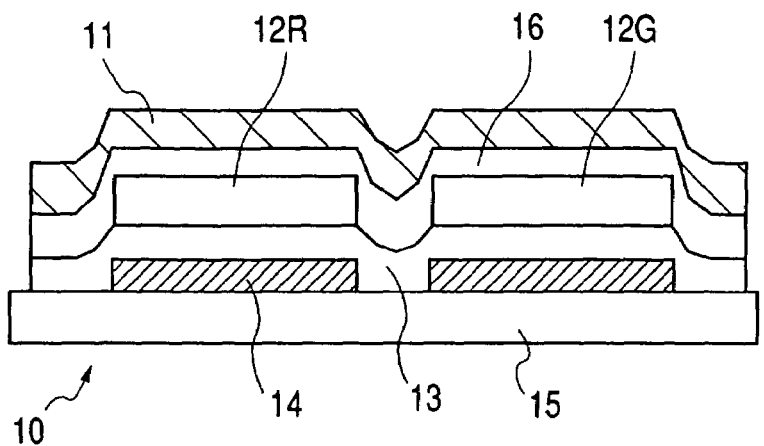
FIG. 7 is a schematic sectional view of a multicolor light-emitting device of Example 1 of the present invention.

A multicolor light-emitting device was prepared which is similar to that shown in FIG. 3 and has configuration of FIG. 7. In the present example, the light-emitting layer 12 that was prepared only had the light emission spectra of two colors of green and red.

A substrate obtained by forming ITO of 100 nm on a glass substrate (Corning Company: 1737) (transparent substrate 15) was used for patterning by photolithography to form the cathode (transparent electrode 14), thereby forming an ITO substrate.

On the ITO substrate, the under-mentioned organic compound layer and electrode layer (reflecting electrode 11) were continuously deposited by the vacuum deposition using resistance heating in a vacuum chamber of $10^{-4}$ Pa to obtain a device A.

Materials that are used and the thickness thereof are shown in Table 1 below. In the present example, the hole-transporting layer corresponds to the second charge-transporting layer 13, and the electron-transporting layer corresponds to the first charge-transporting layer 16.

TABLE 1

| Each function layer | | Material name | Thickness |
|---|---|---|---|
| Hole-transporting layer | | FL03 | 40 nm |
| Light-emitting layer (red) | Host | Alq$_3$ | 20 nm |
| | Guest | Ir(piq)$_3$ 9% | |
| Light-emitting layer (green) | Host | CBP | 20 nm |
| | Guest | Ir(ppy)$_3$ 9% | |
| Electron-transporting layer | | Bathophenantroline | 70 nm |
| Electron-injecting layer | | AlLi | 10 nm |
| Cathode | | Al | 150 nm |

Incidentally, the light-emitting layer used in the device A is composed of the host material doped with the guest material.

The materials shown above were used to form the device A by the co-deposition using in order the masks that have openings in the sections to form the light-emitting layers corresponding to respective colors. The dope concentration was adjusted to a specific concentration by controlling the deposition rate of respective materials at the co-deposition. Incidentally, it is known that Alq$_3$ has high electron-transporting properties and CBT has high hole-transporting properties.

Incidentally, in all of the examples including the present example, the chemical formula of the materials used for the preparation of the multicolor light-emitting device other than the materials shown in the column of BACKGROUND ART are shown below:

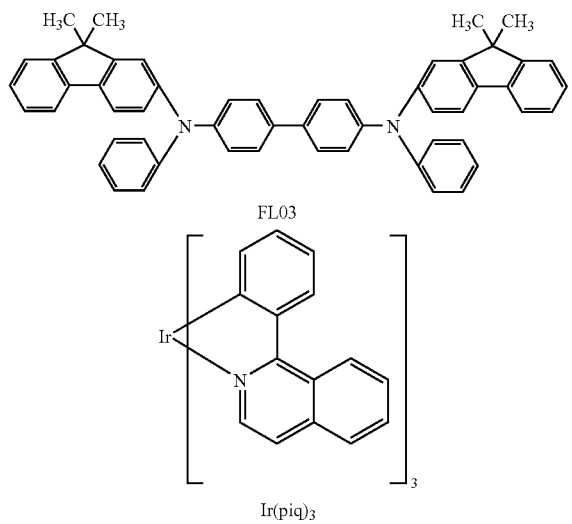

FL03

Ir(piq)$_3$

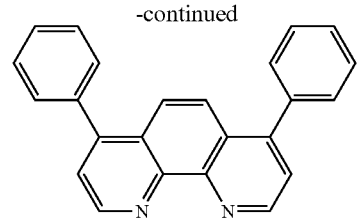

Bathophenantoroline

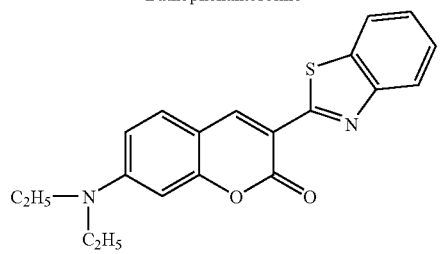

comarin6

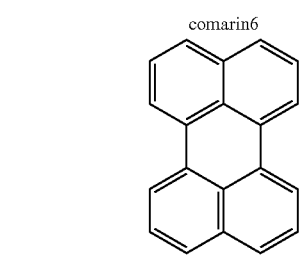

Perylene

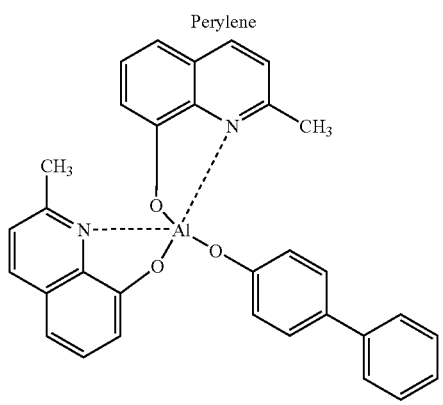

BAlq$_3$

Figure 10A:
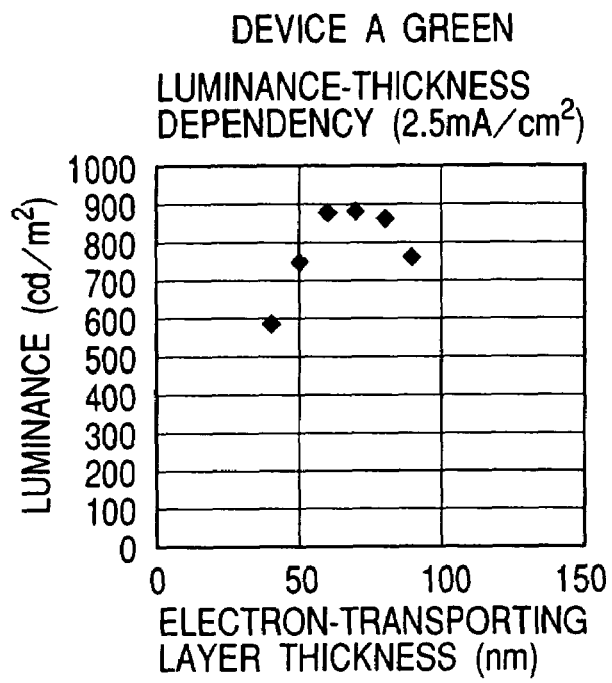
FIGS. 10A and 10B are graphical representations showing the dependency of the layer thickness on the luminance of a device A, FIG. 10A showing the dependency concerning the organic EL device having a green luminescent color that the device A provides, and FIG. 10B showing the dependency concerning the organic EL device having a red luminescent color that the device A provides.
Figure 10B:
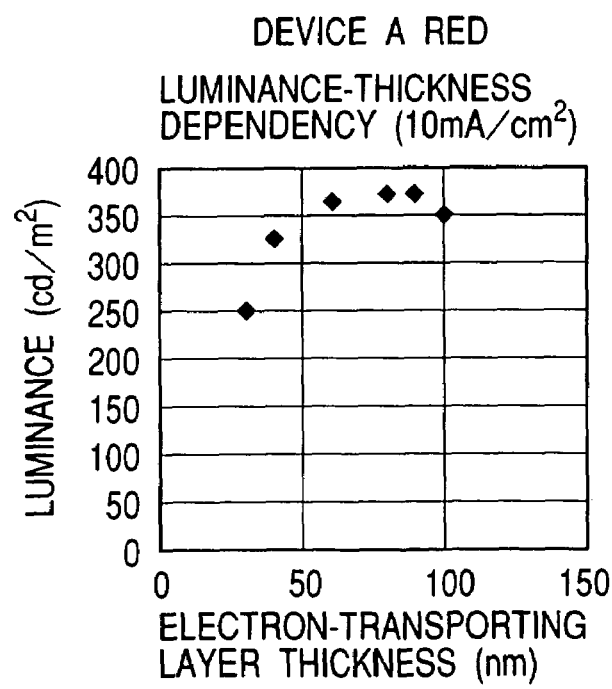

Moreover, FIGS. 10A and 10B show the results of the measurement of dependency of the emission efficiency on the electron-transporting layer thickness for each of the organic EL device having a red luminescent color and the organic EL device having a green luminescent color, each having the configuration described above.

According to FIGS. 10A and 10B, it is apparent that the light emission efficiency is the highest when the electron-transporting layer has a thickness of around 70 nm for both of the organic EL device of green and the organic EL device of red, in the configuration of the above described present example.

EXAMPLE 2

Figure 8:
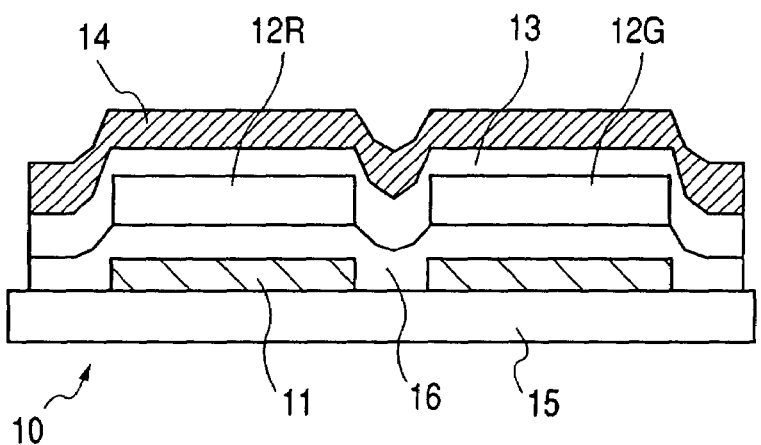
FIG. 8 is a schematic sectional view of a multicolor light-emitting device of Example 2 of the present invention.

In the present example, there was prepared a multicolor light-emitting device in which the light-emitting layer 12 having the emission spectra of two colors of green and red was formed and the reflecting electrode 11 was formed on the side of the transparent substrate 15, as shown in FIG. 8.

A Cr film having a thickness of 100 nm was formed on a glass substrate (Corning Company: 1737) (transparent substrate 15) by using a sputtering process, and the film was subjected to the patterning by a lift-off process to form the anode that reflects light (reflecting electrode 11). Thus, a Cr substrate was formed.

On this Cr substrate, the undermentioned organic compound layer and electrode layer (transparent electrode 14) were continuously deposited by the vacuum deposition using resistance heating in a vacuum chamber of $10^{-4}$ Pa to obtain a device B.

Materials that are used and the thickness thereof are shown in Table 2 below. In the present example, the hole-transporting layer corresponds to the first charge-transporting layer 16, and the electron-transporting layer corresponds to the second charge-transporting layer 13.

TABLE 2

| Each function layer | | Material name | Thickness |
|---|---|---|---|
| Hole-transporting layer | | FL03 | 70 nm |
| Light-emitting layer (red) | Host | CBP | 20 nm |
| | Guest | Ir(piq)$_3$ 9% | |
| Light-emitting layer (green) | Host | Alq$_3$ | 20 nm |
| | Guest | Comarin 6 1% | |
| Electron-transporting layer | | Bathophenantroline | 50 nm |
| Electron-injecting layer | | AlLi | 1 nm |
| Cathode | | ITO | 150 nm |

The light-emitting layer used in the device B of the present example is also composed of the host material doped with the guest material. In addition, the device B of the present invention is adapted to take out light from the side where the film is formed, by using ITO as the cathode.

Figure 11A:
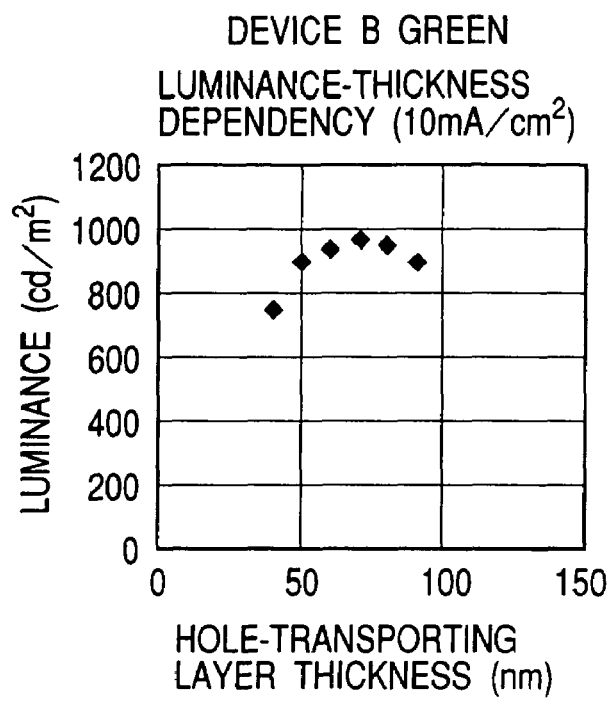
FIGS. 11A and 11B are graphical representations showing the dependency of the layer thickness on the luminance of a device B, FIG. 11A showing the dependency concerning the organic EL device having a green luminescent color that the device B provides, and FIG. 11B showing the dependency concerning the organic EL device having a red luminescent color that the device B provides.
Figure 11B:
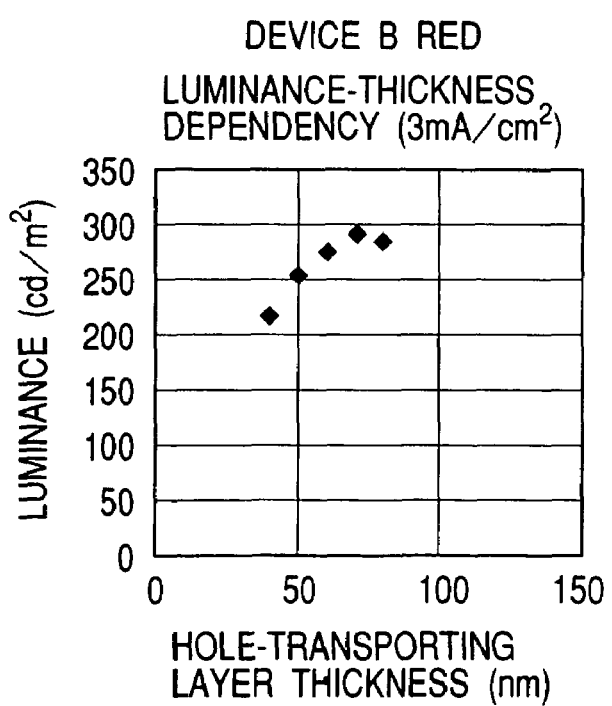

Moreover, FIGS. 11A and 11B show the results of the measurement of dependency of the light emission efficiency on the hole-transporting layer thickness for each of the organic EL device having a red luminescent color and the organic EL device having a green luminescent color, each having the configuration described above.

According to FIGS. 11A and 11B, it is apparent that the light emission efficiency is the highest when the hole-transporting layer has a thickness of around 70 nm for both of the organic EL device of green and the organic EL device of red, in the configuration of the above described present example.

EXAMPLE 3

Figure 9:
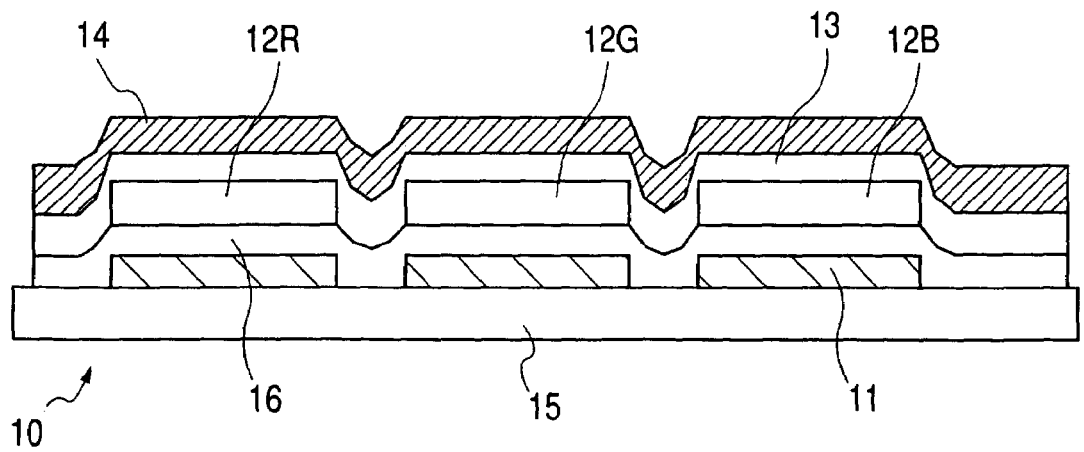
FIG. 9 is a schematic sectional view of a multicolor light-emitting device of Example 3 of the present invention.

In the present example, there was prepared a multicolor light-emitting device in which the light-emitting layer 12 having the emission spectra of three colors of red, blue and green was formed and the reflecting electrode 11 was formed on the side of the transparent substrate 15, as shown in FIG. 9.

A Cr film having a thickness of 100 nm was formed on a glass substrate (Corning Company: 1737) (transparent substrate 15) by using a sputtering process, and the film was subjected to the patterning by a lift-off process to form the anode that reflects light (reflecting electrode 11). Thus, a Cr substrate was formed.

On this Cr substrate, the undermentioned organic compound layer and the electrode layer (transparent electrode 14) were prepared similar to Example 2 to obtain a device C.

The used materials and the thickness thereof are shown in Table 3 below, and they are the same as in Example 2 except for providing a light-emitting layer of blue. In the present example, the hole-transporting layer corresponds to the first charge-transporting layer 16, and the electron-transporting layer corresponds to the second charge-transporting layer 13.

TABLE 3

| Each function layer | | Material name | Thickness |
|---|---|---|---|
| Hole-transporting layer | | FL03 | 70 nm |
| Light-emitting layer (red) | Host | CBP | 20 nm |
| | Guest | Ir(piq)$_3$ 9% | |
| Light-emitting layer (green) | Host | Alq$_3$ | 20 nm |
| | Guest | Comarin 6 1% | |
| Light-emitting layer (blue) | Host | Balq | 20 nm |
| | Guest | Perylene | |
| Electron-transporting layer | | Bathophenantroline | 50 nm |
| Electron-injecting layer | | AlLi | 1 nm |
| Cathode | | ITO | 150 nm |

Incidentally, BAlq is known to have high electron-transporting properties.

FIG. 12 shows the results of the measurement of dependency of the light emission efficiency on the hole-transporting layer thickness for the organic EL device having a blue luminescent color having the configuration described above.

From FIG. 12, it is apparent that the organic EL device of blue has the highest light emission efficiency when the hole-transporting layer has a thickness of around 50 nm, and that it shows high light emission also in a thickness of around 70 nm.

The device C prepared as described above was driven according to each of the conditions below. The light emission having a luminance of about 300 cd/m$^2$ occurred, showing good properties.

R: 3 mA/cm$^2$
G: 6 mA/cm$^2$
B: 3 mA/cm$^2$

As shown above, according to the present invention, in the multicolor light-emitting device comprising a plurality of organic EL devices each having two or more luminescent colors, the take-out efficiency of the emission of each color can be optimized even by giving the same thickness to the charge-transporting layer for each color, whereby an organic EL device having a low price and high efficiency can be provided.

The invention claimed is:

1. A multicolor light-emitting device comprising at least a first and a second organic electroluminescence devices provided on a substrate, the first and the second organic electroluminescence devices emitting lights of different colors, and each of the organic electroluminescence devices having at least;

a first electrode arranged on a side of reflecting light;
a second electrode, opposed to the first electrode, arranged on a side of light extracted; and
an electroluminescence layer comprising an organic compound layer arranged between the first electrode and the second electrode,
the first electrode being provided closer to the substrate than the second electrode;
wherein a light-emitting region of the first organic electroluminescence device is located on the first electrode side of the electroluminescence layer of the first organic electroluminescence device,
wherein a light-emitting region of the second organic electroluminescence device is located on the second electrode side of the electroluminescence layer of the second organic electroluminescence device, wherein the electroluminescence layer of the first organic electroluminescence device is a layer having a carrier transporting property in which electrons are more readily transported compared to holes, and the electroluminescence layer of the second organic electroluminescence device is a layer having a carrier transporting property in which holes are more readily transported compared to electrons, wherein each of the first and the second organic electroluminescence devices has a first layer between the electroluminescence layer and the first electrode, and has a second layer between the electroluminescence layer and the second electrode, wherein a thickness (da1) of the first layer of the first organic electroluminescence device satisfies the following equation:

$$n1 da1 = \frac{\lambda a}{4}(1 + 2i)$$

wherein i denotes zero or a positive integer, n1 denotes a refractive index of a first charge-transporting layer, and λa denotes a peak emission wavelength of one organic electroluminescence device; and a thickness (db1) of the first layer and a thickness (db3) of the electroluminescence layer of the second organic electroluminescence device satisfy the following equation:

$$nb1 db1 + nb3 db3 = \frac{\lambda b}{4}(1 + 2i)$$

and wherein i denotes zero or a positive integer, nb1 denotes the n1, db1=da1, nb3 denotes a refractive index of the electroluminescence layer of the one organic electroluminescence device, and λb denotes a peak emission wavelength of one organic electroluminescence device.

2. The multicolor light-emitting device according to claim 1, wherein the first organic electroluminescence device emits a light of shorter wavelength than the second organic electroluminescence device.

3. The multicolor light-emitting device according to claim 2, wherein the second organic electroluminescence device emits red light.

4. The multicolor light-emitting device according to claim 1, wherein each of the electroluminescence layer of the first organic electroluminescence device and the electroluminescence layer of the second organic electroluminescence device independently has a thickness from 10 nm to 35 nm.

5. The multicolor light-emitting device according to claim 1, wherein the first layer of the first organic electroluminescence device and the first layer of the second organic electroluminescence device have the same thickness.

6. The multicolor light-emitting device according to claim 1, wherein the first layer is a hole-transporting layer and the second layer is an electron-transporting layer.

7. The multicolor light-emitting device according to claim 1, further comprising a third organic electroluminescence device wherein the first organic electroluminescence device, the second organic electroluminescence device and the third organic electroluminescence device emit a different color of either blue, green or red light, respectively.

8. A display apparatus having the multicolor light-emitting device according to claim 1.

* * * * *